United States Patent
Kiruluta

(10) Patent No.: US 9,726,736 B2
(45) Date of Patent: Aug. 8, 2017

(54) TRAVELING WAVE MRI IN HIGH BO FIELD STRENGTHS

(75) Inventor: Andrew Kiruluta, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 1109 days.

(21) Appl. No.: 13/819,275

(22) PCT Filed: Aug. 18, 2011

(86) PCT No.: PCT/US2011/048240
§ 371 (c)(1),
(2), (4) Date: Jun. 6, 2013

(87) PCT Pub. No.: WO2012/030548
PCT Pub. Date: Mar. 8, 2012

(65) Prior Publication Data
US 2013/0241549 A1  Sep. 19, 2013

Related U.S. Application Data

(60) Provisional application No. 61/378,210, filed on Aug. 30, 2010.

(51) Int. Cl.
*G01R 33/32* (2006.01)
*G01R 33/44* (2006.01)
*G01R 33/48* (2006.01)

(52) U.S. Cl.
CPC ........... *G01R 33/32* (2013.01); *G01R 33/445* (2013.01); *G01R 33/4802* (2013.01)

(58) Field of Classification Search
CPC ... G01R 33/32; G01R 33/445; G01R 33/4802
See application file for complete search history.

(56) References Cited

U.S. PATENT DOCUMENTS

| 4,748,409 A | 5/1988 | Frahm et al. |
| 2008/0129298 A1* | 6/2008 | Vaughan ............... G01R 33/583 324/322 |

(Continued)

FOREIGN PATENT DOCUMENTS

DE  202010003162  5/2010

OTHER PUBLICATIONS

Andrew Kiruluta, "The emergence of the propagation wave vector in high field NMR: analysis and implications", Journal of Physics D. Applied Phys. 40 (2007) pp. 3043-3050.*

(Continued)

*Primary Examiner* — G. M. Hyder
(74) *Attorney, Agent, or Firm* — O'Shea Getz P.C.

(57) ABSTRACT

In an MRI scanner, the transmission and reception of RF excitation and detected signal waves is accomplished using far field excitation instead of conventional near field excitation. By superimposing two counter-propagating waves from the same source in the MRI sample interference fringes are recorded in the sample in such a way that the relative phase between the two propagation wave vectors determines the periodicity of the maxima and minima in the interference fringe pattern. The complete fringe pattern, known as a spatial hologram, contains both the phase and amplitude information of the information-bearing wave. When exposed to a replica of the original reference wave, the fringe pattern acts as a diffraction grating, reproducing the information-bearing field propagating at the same relative phase.

16 Claims, 6 Drawing Sheets

(56) References Cited

U.S. PATENT DOCUMENTS

2008/0186026 A1* 8/2008 Leussler ............. G01R 33/422
  324/318
2013/0069647 A1* 3/2013 Umathum ............ G01R 33/345
  324/309
2013/0200897 A1* 8/2013 Ashwin ............. G01R 33/4802
  324/318

OTHER PUBLICATIONS

Brunner et al. "Travelling wave nuclear magnetic resonance", Nature, vol. 457, Feb. 19, 2009, pp. 994-998.*
Tonyushkin et al. "MR in the Far Field: From Mode Transformation and Holography to Quasi-Optics", Jun. 2011, IEEE International Microwave Symposium.
"In the Lab with Dr. Andrew J. Kiruluta", Feb. 2010, http://wng.fsu.edu/cbe/announcements/in_the_lab.html.
Andrew Kiruluta, "The Emergence of the Propagation Wave Vector in High Field NMR: Analysis and Implications", Journal of Physics D. Applied Physics, vol. 40, No. 10, May 21, 2007, pp. 3043-3050.
Andrew Kiruluta, "Multidimentional Spatial-Spectral Holographic Intepretation of NMR Photography", The Journal of Chemical Physics, vol. 124, 2006, pp. 194108-1-194108-10.
Brunner et al. "Travelling Wave Nuclear Magnetic Resonance", Nature, vol. 457, Feb. 1, 2009, pp. 994-998.
Brunner et al. "Reciprocity Relations in Traveling Wave MRI", Proc. Intl. Soc. Mag. Reson. Med. 17, 2009, p. 2943.

\* cited by examiner

TRAVELING WAVE MRI IN HIGH B0 FIELD STRENGTHS

BACKGROUND

Magnetic resonance imaging (MRI) is a noninvasive medical imaging technique used in radiology to visualize detailed internal structure of a living body. The technique is based on physical principles of nuclear magnetic resonance. Nuclear magnetic resonance, in turn, relies on an atomic property called "spin." Each proton, electron and neutron in an atom possesses a spin and the net nuclear spin of a particular atomic nucleus is the sum of spins from unpaired protons and neutrons. For example, the nucleus of a hydrogen atom contains one proton and therefore has a net nuclear spin.

A spin can also be thought of as a magnetic moment vector. When atoms with net nuclear spins are placed in an external magnetic field, the magnetic moment vectors of some of the nuclei will precess around the direction of the external field with an orientation that depends on the energy state of the nuclei. This orientation can change as the nuclei absorb and release photons. In a typical sample placed in an external magnetic field, a large number of nuclei are continually transitioning between energy states so that the difference between the number of nuclei in each state produces a net magnetization vector in the sample which points in the direction of the external magnetic field.

The direction of this vector can be altered by applying a radio frequency excitation field with a frequency at which the nuclei resonate while it is in the external magnetic field. When the field is removed, the net magnetization vector returns to its original orientation over time by releasing photons that can be detected as an RF signal. This signal is referred to as the free induction decay (FID) response signal. The time required for the magnetization vector to return to its original orientation is called the relaxation time and varies for different materials. Therefore, different tissues can be distinguished.

The frequency the nuclei resonate at depends on the strength of the applied external magnetic field. The photons released when the RF excitation field is removed have an energy and a frequency that depends on the amount of energy the nuclei absorbed while the excitation field was present. During an MRI scan an additional gradient field is applied to make the external magnetic field strength depend on position, in turn making the frequency of the released photons dependent on position in a predictable manner. Position information can then be recovered from the resulting signal by the use of a Fourier transform.

The excitation RF resonant frequency, also known as the Larmor frequency, is equal to $\gamma \cdot B$ where B is the magnetic field strength in tesla (T) and $\gamma$ is a gyromagnetic ratio that is specific to a particular nucleus. Since the human body consists mostly of water molecules that have two hydrogen nuclei or protons, MRI systems use proton spins for imaging. The gyromagnetic ratio for hydrogen is 42.58 MHz/T. For typical MRI systems that use 1.5 T magnetic fields, the RF resonant frequency is approximately 64 MHz. As the field strength of the external magnetic field increases the RF excitation frequency also increases and accordingly, the RF excitation wavelength decreases.

More recently, many MRI systems have been using higher magnetic field strengths, on the order of 3 T. These so-called high-field systems have several advantages including higher picture resolution, faster scans, better signal-to-noise ratios and the ability to visualize physiological processes. Ultra high field strength MRI scanners with field strengths of 4 T or greater are also available.

It would be desirable to further increase the picture resolution, reduce image acquisition time and increase the signal-to-noise ratio in MRI systems.

SUMMARY

In accordance with the principles of the invention, the transmission and reception of the RF excitation and detected signal waves is accomplished using far field excitation instead of conventional near field excitation. Coherent effects, such as wave interference, are used to create an interference pattern in the sample from which a holographic image can be reconstructed.

Far field excitation relies on propagation of waves in a waveguide either already existing or placed inside the scanner bore. By superimposing two counter-propagating waves from the same source in the MRI sample interference fringes are recorded in the sample in such a way that the relative phase between the two propagation wave vectors determines the periodicity of the maxima and minima in the interference fringe pattern. The complete fringe pattern, known as a spatial hologram, contains both the phase and amplitude information of the information-bearing wave. When exposed to a replica of the original reference wave, the fringe pattern acts as a diffraction grating, reproducing the information-bearing field propagating at the same relative phase.

Any information-bearing excitation then is recorded in this MR absorption spectrum when it "burns" specific holes in the spectrum corresponding to its frequency content. In this way, an interference fringe pattern can be stored as a distribution of spectral holes in the absorption spectrum of the sample and remains frozen in the sample with a persistence proportional to the $T_1$ time of the material, resulting in an MR spectral grating. This interference fringe pattern "burnt" in the MR sample allows for the spectral holographic reconstruction of the stored phase and amplitude information when a broadband reference readout field is subsequently applied to the sample.

DETAILED DESCRIPTION

Figure 1:
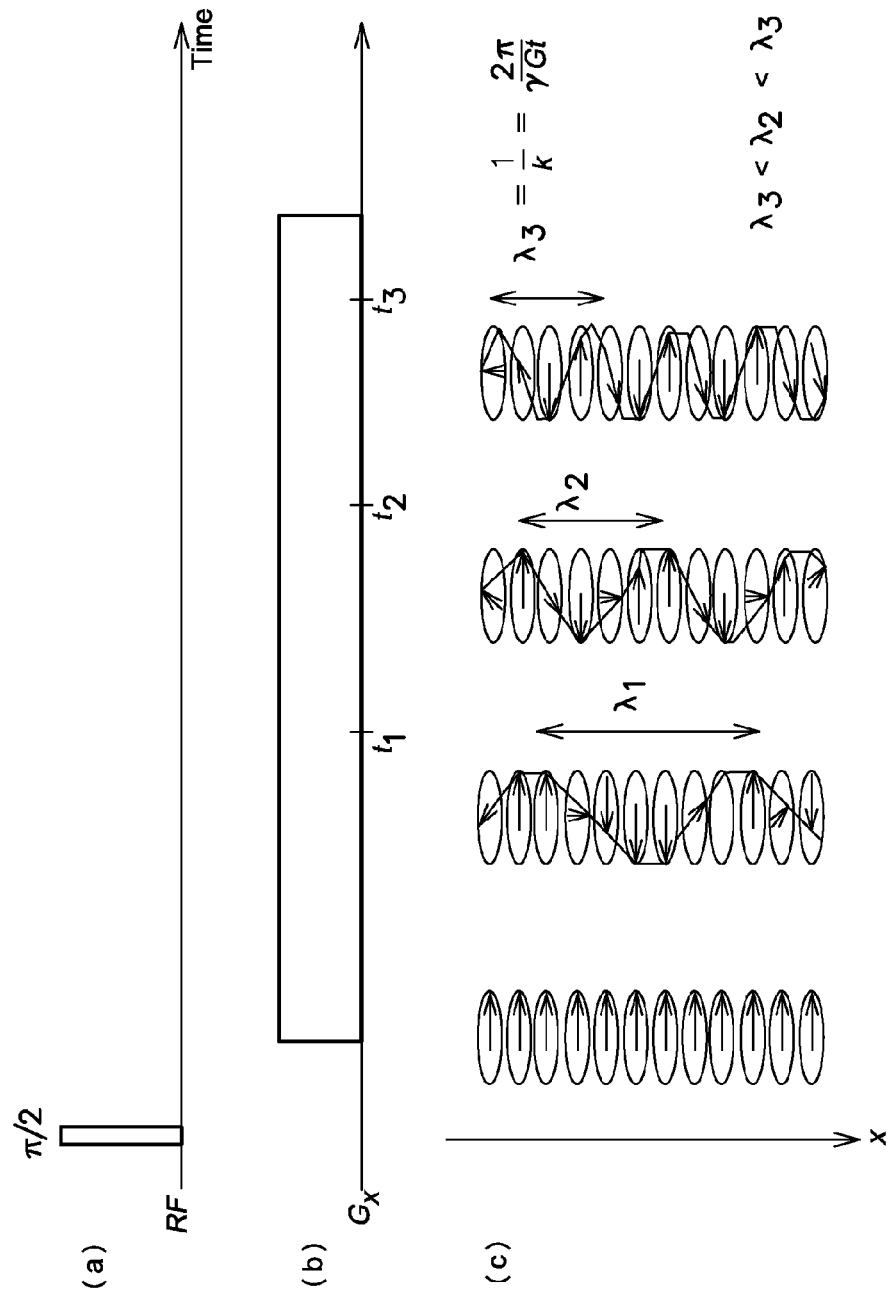
FIGS. 1(a) to 1(c) graphically illustrate the development of transverse magnetization spin phase under the influence of an applied magnetic field, resulting in a helical phase twist with a characteristic wavelength along the gradient axis.

For applied external magnetic fields with ultra high field strengths, the RF excitation wavelength and the MRI scanner field of view (FOV) become commensurate. For example, with an applied external magnetic field with a field strength of 7 T, the free space RF excitation wavelength corresponds to about 1 m. This wavelength is further reduced to the dielectric constant of the sample. The dielectric constant in a biological sample can be as high as 80 due to high water content, and at a Larmor frequency of 300 MHz, this corresponds to a wavelength inside the tissue of less than 15 cm. The RF excitation wavelength is thus comparable to the diameter of most in vivo FOVs. Therefore, both temporal and spatial variations of the excitation field and an expected increase in field conductivity affect the resulting signal. In particular, it has been found that the propagation of radiation at ultra high fields (>4 T) generates phenomena commonly observed in quantum optics but traditionally neglected in MRI systems, including phase modulation of the excitation field as well as wave interference.

More specifically, a spatial-spectral interference pattern can be produced in the sample as a result of interference between two excitation pulses. This can be shown by considering a spin echo NMR experiment in which an NMR sample is placed in an external magnetic field that has an applied gradient. Two far field excitation pulses modified to include the spatial dependence of a traveling wave are then applied to the sample. The first pulse resonantly excites the gradient dispersed inhomogeneously broadened sample setting up a spectral grating consisting of spectral holes for each respective frequency component in the excitation pulse. When the second refocusing pulse arrives at a later time τ, it also resonantly interacts with the already excited spin isochromats. Since the spins retain the phase information from the first pulse, the interaction of the second pulse with the spins creates a weighted spin density amplitude and phase sensitive interference grating in the medium. This results in an overall modulation throughout the spatial-spectral inhomogeneous distribution function of the spin system. The two dimensional spatial-spectral Fourier transform of the two excitation pulses may be expressed without loss of generality, as $$E(k,\omega) = \iint e(\vec{r},l)e^{[i(\omega t - k \cdot \vec{r})]}dld\vec{r}$$

where k is the wave propagation vector of the excitation pulses which should not be confused with the gradient imposed wave functions that are used for spatial encoding and which will be denoted as $k_g = (k_x(t), k_y(t), k_z(t))$. If the two pulses are separated in time by an amount τ, then the modulation of the spin population inversion is due to the combined power spectrum of the pulses which can be written as the square of the field amplitudes:

$$I(x,y) = \left| E_1(k_1, \omega)e^{i\vec{k}_1 \cdot \vec{r}} + \rho(\vec{r})e^{\phi(\vec{r},t)}E_2(\omega)e^{-i\omega\tau}e^{i\vec{k}_2 \cdot \vec{r}} \right|^2$$

$$= B + E_1^*(k_1, \omega)E_2(k_2, \omega)\rho(\vec{r})e^{-i[\omega\tau - (\vec{k}_2 - \vec{k}_1)\cdot\vec{r}] + \phi(\vec{r},t)} +$$

-continued $$E_1(k_1, \omega)E_2^*(k_2, \omega)\rho^*(\vec{r})e^{i[\omega\tau + (\vec{k}_1 - \vec{k}_2)\cdot\vec{r}] - \phi(\vec{r},t)}$$

where B is a dc term representing the individual power spectrums of the two waveforms relative to the signal terms. Essentially, the first pulse acts on a "fresh" unmodulated longitudinal magnetization which has been denoted by unity since all the spins within this volume or slab of interest are spatially unresolved (transversely in the xy plane) while the second pulse (and any other subsequent pulses assuming no magnetization spoiling) acts on a history built up in the time interval τ which is represented as a dephasing modulation weighting function $$\rho(\vec{r})e^{\phi(\vec{r},t)}$$

on the spin system. This formulation also allows for taking into account gradient echo based spin encoding by assuming that the first and second pulse temporally overlap and the dephasing is due to gradient encoding.

The last two terms are spatial-spectral holographic interference terms. They arise from the interference between the two-excitation pulses, which results in the recording of the phase information in the NMR medium as a variation in the ground state population of the spin system.

A simple hologram can be made by superimposing two propagating waves from the same source in a medium that is capable of recording the resulting interference fringes. The fringes are recorded in such a way that the relative phase between the two propagation wave vectors determines the periodicity of the maxima and minima in the interference fringe pattern. The complete fringe pattern, known as a spatial hologram, contains both the phase and amplitude information of the information-bearing wave. When exposed to a replica of the original reference wave, the fringe pattern acts as a diffraction grating, reproducing the information-bearing field propagating at the same relative phase. Fringes also can be produced between two matching frequency beams in a medium with a spectrally selective absorption spectrum to create a spectral grating/hologram.

In an MR sample, spectral holography arises naturally either due to the applied field gradients used for spatial encoding or due to the inherent chemical anisotropy of the sample resulting in an absorption spectrum. Any information-bearing excitation then is recorded in this MR absorption spectrum when it "burns" specific holes in the spectrum corresponding to its frequency content. In this way, an interference fringe pattern can be stored as a distribution of spectral holes in the absorption spectrum of the sample and remains frozen in the absorber with a persistence proportional to the $T_1$ time of the material, resulting in an MR spectral grating. This interference fringe pattern "burnt" in the MR sample allows for the spectral holographic reconstruction of the stored phase and amplitude information when a broadband reference readout field is subsequently applied to the sample.

Figure 2:
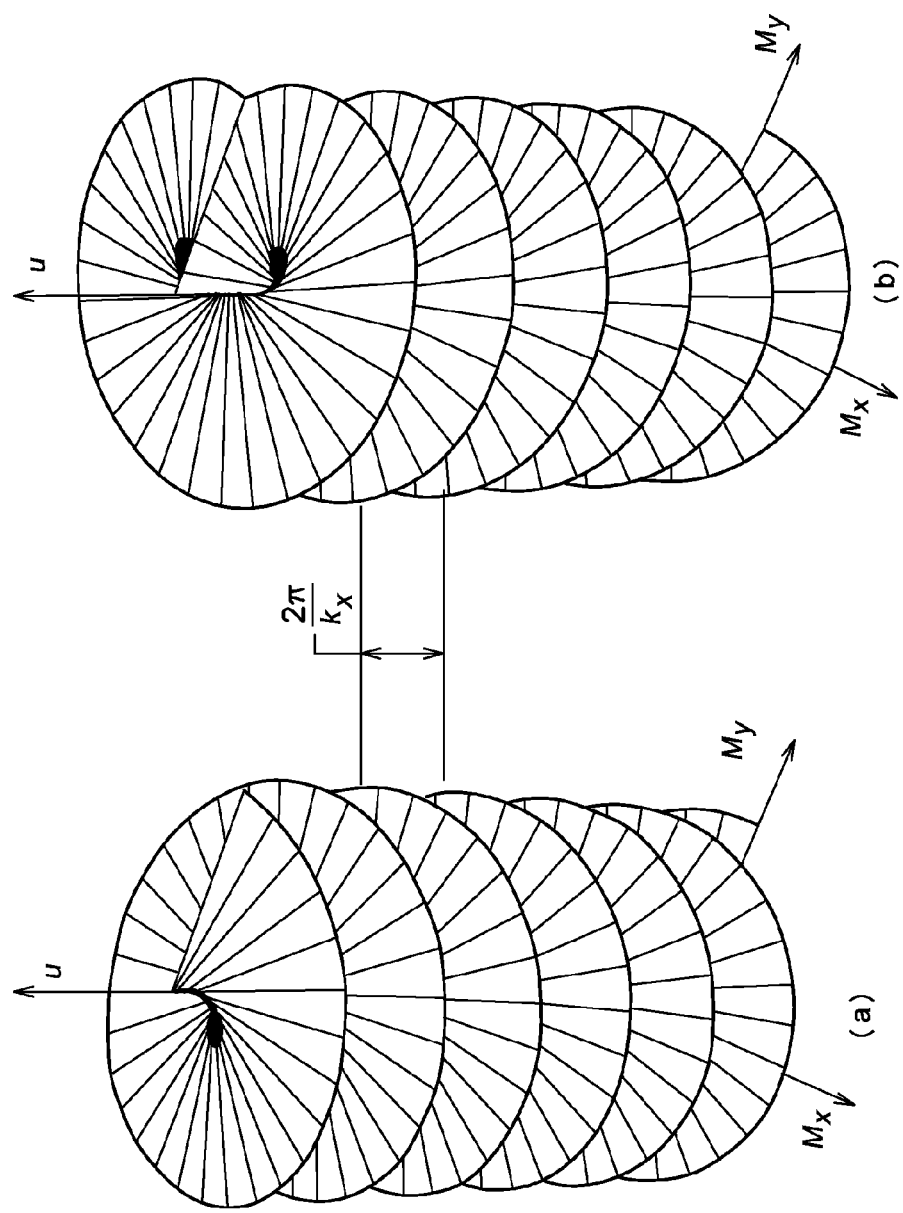
FIGS. 2(a) and 2(b) schematically illustrate a magnetization grating caused by a linear field modulation along a gradient axis direction.

FIGS. 1 and 2 show how a conventional RF excitation pulse can be used for spatial encoding. Here a sample is placed in an external magnetic field (traditionally this field has a direction along the z coordinate of an x, y, z coordinate system). A conventional RF excitation pulse is applied to the system as shown in FIG. 1(a). A linearly increasing magnetic gradient is subsequently applied in a direction along the x coordinate as shown in FIG. 1(b). As viewed from the phase space of spin precession, the nuclear spins are exposed to a linearly increasing field in the direction of the applied gradient so that along that direction, there occurs a sinusoidally varying phase grating with wavelength equal to the inverse of the gradient wave vector k(t) at time instant t. Hence, the gradient sets up a standing wave in the phase space of the precessing spins as shown in the FIG. 1(c) resulting in a helical phase twist with characteristic wavelength λ, along the gradient axis (x). The left column of FIG. 1(c) shows the spins before the application of the gradient, the next three columns to the right show the spins at time $t_1$, $t_2$ and $t_3$, respectively. As shown, the wavelength λ becomes progressively shorter with increasing time. This standing wave is equivalent to a three dimensional helical pattern grating along the direction of the gradient (u) as depicted in FIG. 2. FIG. 2(a) shows a right-handed helical modulation of the magnetization and FIG. 2(b) shows a left-handed helical modulation of the magnetization, both of which correspond to phase-modulated grating components in the transverse plane. Thus, gradient evolution may be visualized as the tightening of the spin phase helix in the direction of the gradient. If the magnetic field gradient is static, the effect of the field is to produce a modulation of k that is linear in time.

Figure 3:
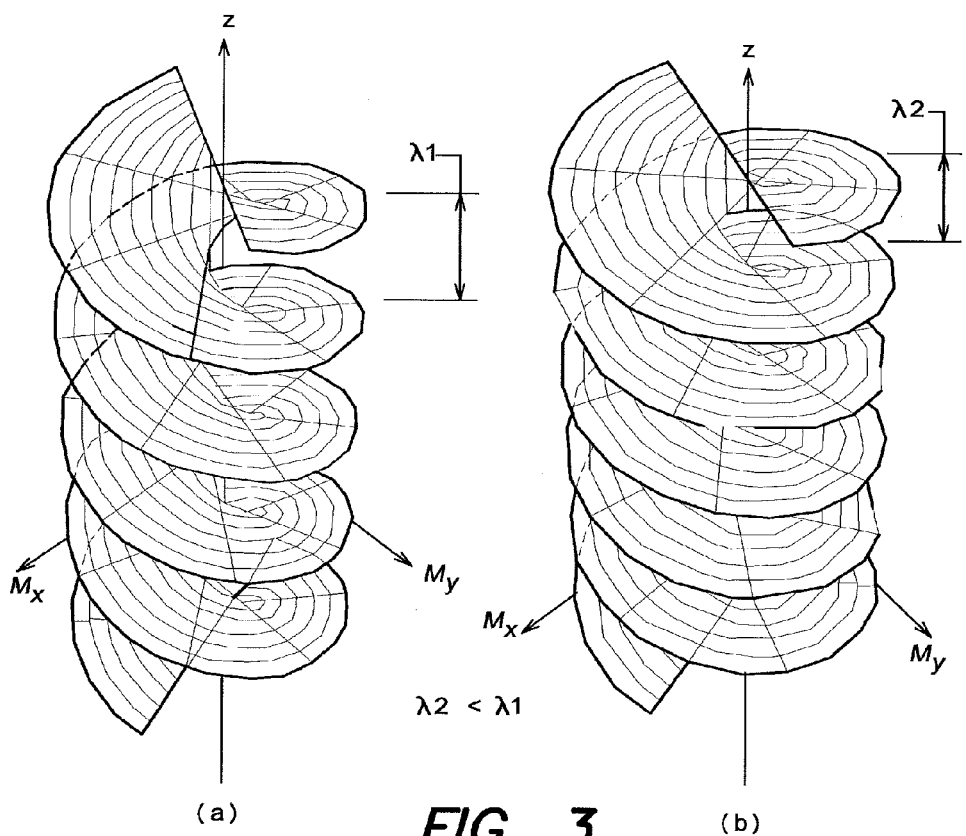
FIG. 3(a) schematically shows a helical phase winding pattern produced by a traveling excitation wave along the z axis.
FIG. 3(b) schematically shows a helical phase winding pattern produced by a combination of traveling excitation wave in the direction of an applied gradient showing a tightening of the helical phase pattern.

FIG. 3 shows how a traveling wave excitation can be used for spatial encoding with increased resolution. In a similar fashion to the conventional excitation pulse shown in FIGS. 1 and 2, a propagating excitation wave leads to a similar effect on the spins by imposing a linearly increasing phase modulation of the spins with a grating wavelength corresponding to the inverse of the wave number as shown FIG. 3(a) which has been produced from a simulation of a traveling excitation field. FIG. 3(a) shows a helical phase winding pattern due to a traveling excitation wave along the z axis with a wavelength given by $$\lambda = \frac{2\pi}{k}.$$

For example, with an applied external magnetic field with a field strength of 7 T, the free space wavelength is about 1 m, while in a biological media with a typical dielectric constant of about 95, the wavelength shortens to about 10 cm. This is a rather poor resolution if propagating wave spin was encoded only with the propagating wave vector k. However, both the standing wave from the gradient encoding as shown in FIGS. 1 and 2 can be combined with the traveling wave vector k from the far field excitation field to yield much higher resolution as shown in the FIG. 3(b), which was obtained from a numerical simulation of the Maxwell-Bloch equation with far field excitation. This is because the effective gradient $G_{eff}$ is the combination of the conventional linear gradient field with that due to the wave propagation vector k.

This can be better understood in terms of the slice selective problem in MRI. After slice selection, a residual phase is left along the slice encoding direction. If the excitation wave is traveling in the same direction, then it can be designed to coherently add to this residual phase in such a way that an overall linear phase is left in the direction of propagation/slice selection. This residual phase thus serves to spatially encode spin in this direction at a much higher spatial resolution than the original residual phase from just the slice selection gradient field. The overall residual helical pattern is thus tighter than the case of gradient encoding only.

Figure 4:
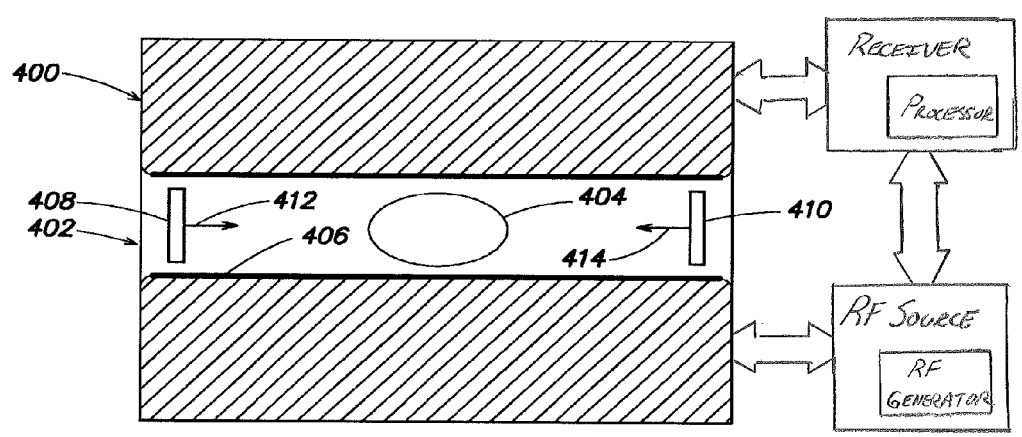
FIG. 4 is cross-sectional diagram of a scanner magnet bore showing the waveguide and patch antennas used to generate the counter-propagating excitation waves and receive the resulting FID signal.

FIG. 4 shows schematically a cross section along the scanner magnet axis of an arrangement for generating traveling excitation waves in the bore of an MRI scanner magnet using two separate patch antennas. Magnet 400 has a bore 402 which is typically cylindrical. The sample 404 to be imaged is placed in the center of the magnet bore 402. In order to launch a traveling wave in the magnet bore 402, a waveguide 406 is provided along the inside wall of the bore 402. An existing RF shield found in many scanners may be used for this waveguide or a separate waveguide may be inserted into the magnet bore 402. The counter propagating RF excitation waves are generated by conventional patch antennas 408 and 410 which launch propagating waves in directions 412 and 414, respectively. One of antennas 408 and 410 can also be used to receive the FID response signal.

Traveling waves inside a bore of a scanner can propagate only as RF modes of the cylindrical or coaxial waveguides 406 illustrated in FIG. 4. While requirements of mode propagation inside a waveguide impose certain limitations, the advantage of such waveguides is easiness of specific mode excitation, low power loss for dominant modes and robustness of implementation. Since MR scanners have cylindrical symmetry, the waveguides are ideally suited for far-field traveling waves.

There are two basic types of modes in cylindrical waveguide: TE and TM. The TE modes have all three components of the B-field including longitudinal one, which is collinear with external applied magnetic field (the scanner $B_0$ field), while the TM modes have B-field components only in the excitation (transverse) plane. Furthermore, the magnitude of each component of the field (B and E) has spatial dependence, which is characterized by the integer numbers m, n that represent azimuthal and radial field variations, respectively.

Figure 5:
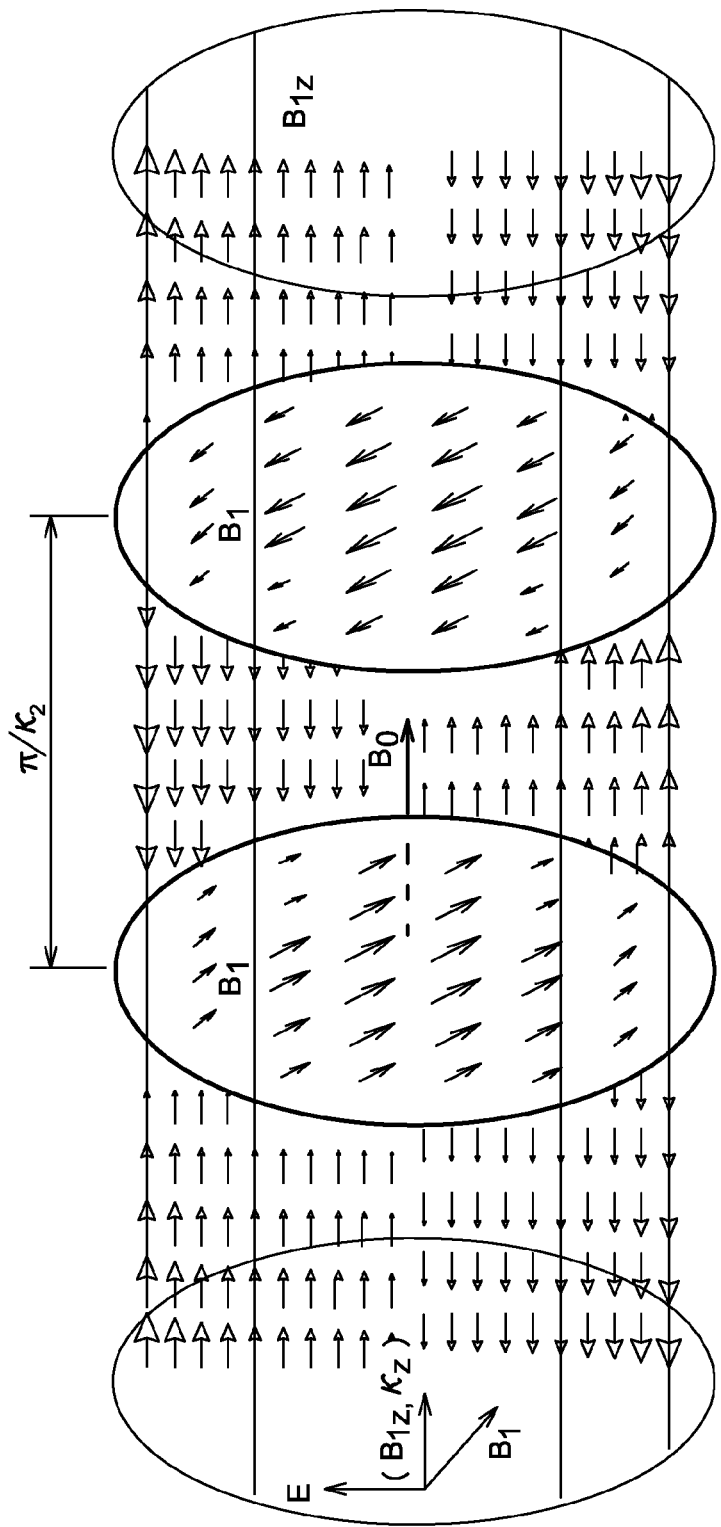
FIG. 5 is a schematic diagram illustrating the magnetic field from a traveling wave ($TE_{11}$ mode) inside cylindrical waveguide one wavelength long.
Figure 6:
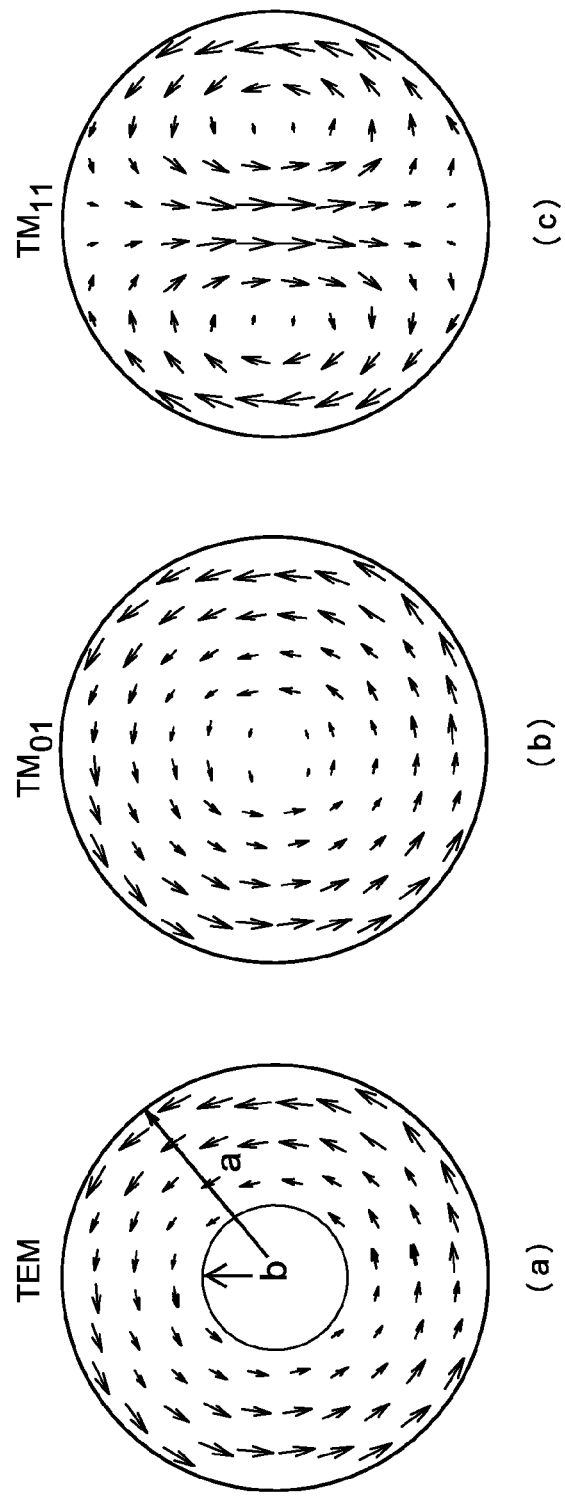
FIGS. 6(a)-6(c) is a schematic diagram showing the transverse B-field configurations of TEM and TM modes of coaxial and cylindrical waveguides.

The B-field configurations of the basic $TE_{mn}$ ($TM_{mn}$) modes suitable for MRI use are shown in FIGS. 5 and 6. FIG. 5 shows the magnetic field from a traveling wave ($TE_{11}$ mode) inside a cylindrical waveguide one wavelength long. The arrows represent magnetic field direction and the spatial magnitude of the field is depicted by the color and the arrow size (light color corresponds to a stronger field). Here $B_1$, $B_{1z}$ are the transverse and longitudinal components of traveling wave, respectively; $k_z$ is the propagation wave vector of $TE_{11}$ mode; $B_0$ is the scanner magnet field.

Figure 7:
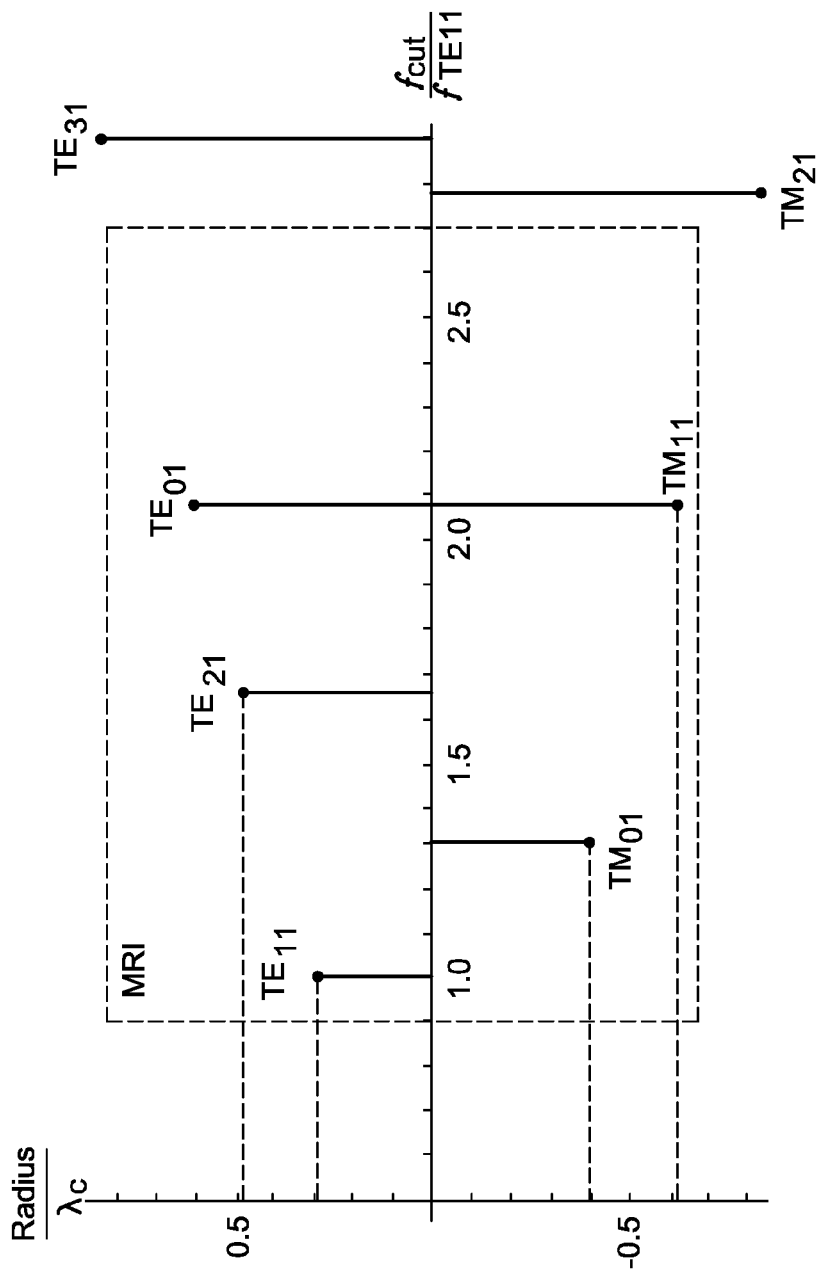
FIG. 7 is a chart showing the propagation and bandwidth of various cylindrical waveguide modes.

FIGS. 6(a)-6(c) show the transverse B-field configuration of TEM (shown in FIG. 6(a)) and TM (shown in FIGS. 6(b) and 6(c)) modes of coaxial and cylindrical waveguides, respectively. The TEM (FIG. 6(a)) and $TM_{01}$ (FIG. 6(b)) modes have similar field structure, which can be used for $TM_{01}$ excitation by varying radius b of center conductor. The $TM_{11}$ mode (shown in FIG. 6(c)) has uniform field central region with linear polarization desirable for MR spin excitation The lowest and thus the dominant mode of a cylindrical waveguide is $TE_{11}$ At ultra-high field strength, the cut-off condition for the lowest waveguide mode propagation can be fulfilled provided that the bore is sufficiently large as shown on the diagram in FIG. 7, which is a cylindrical waveguide mode propagation and bandwidth diagram. The horizontal axis is the cut-off frequency of the propagating mode normalized to the basic cut-off frequency of the $TE_{11}$ mode. The vertical axis is radius of the waveguide (half of the bore diameter) normalized to critical wavelength ($\lambda_c$) of the mode (the TM modes shown as negative for clarity). For $TE_{11}$ propagation, the scanner bore radius (a) has to obey the equation $a>0.3\lambda_c$ and the RF frequency must obey the equation $f \geq 1.7 f_{TE11}$ (for lowest losses), at the same time the $TM_{01}$ mode can propagate if properly excited. For another MRI desirable mode, the $TM_{11}$ mode, $f>2.1 f_{TE11}$ and the bore radius $a>0.6\lambda_c$. The condition on the RF wavelength for single mode propagation, which gives the mode bandwidth, is $0.3\lambda_c < a < 0.38\lambda_c$, where a is half the bore diameter.

As an example, for a clinical 7.0 T human MRI scanning system with a bore radius of 60 cm and a resonant frequency 298 MHz, which corresponds to a free space wavelength of 100.6 cm, only a single $TE_{11}$ mode can propagate inside the waveguide with no dielectric. However, if the waveguide is filled with a dielectric having a dielectric constant of $\in_r > 4$ the optimal condition for propagation of $TE_{11}$ mode is achieved, which corresponds to its lowest dissipation at $f \approx 1.7 f_{cr}$, but $TM_{01}$ and $TE_{21}$ modes can also simultaneously propagate depending on the excitation method (see FIG. 7). Due to the existence of the longitudinal $B_{1z}$ component in the $TE_{11}$ mode, the required power that must be applied per α-pulse is about twice of the excitation power of TM mode for equivalent flip angle.

Despite the existence of longitudinal field component in the lowest mode, which coincides with the magnet field $B_0$, the dominant mode has an advantage of relatively uniform linear polarization component and it can also simultaneously support both orthogonal polarizations due to mode degeneracy. If two degenerate linearly-polarized modes are transmitted with a π/2 phase lag in a circular waveguide, a circularly-polarized traveling wave is effectively generated for magnetization rotation in the far field.

The spatial spin distribution produced by the above procedure constitutes the image as areas with the most concentration of spins will vary from those with less concentration of spins. In the case of the interference, areas of destructive interference will have the spins unperturbed from their ground state while areas of constructive interference will have the most excited spins. Since an MR image is an image of the spatial distribution of spins, any image generated in this case will look like the spatial interference pattern and hence the spin distribution records the interference image. Once the interference pattern has been created in the sample, it can be recalled by reading it out with a reference wave that is similar to one of the original waves used to create the interference. The readout produces FID response signals. An image can be created from this FID signal by interference tomography, which is a generalization of computed tomography to diffracting wavefields. The FID signal can be inverted to estimate the spin density distribution of the sample via a number of conventional methods including filtered backscattering, a generalization of the algebraic reconstruction technique (ART) of conventional computed tomography (CT) to diffraction tomography and the simultaneous iterative reconstructive technique (SIRT).

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. A method for generating a magnetic resonance image of a sample in a magnetic resonance scanner, comprising:
    (a) placing the sample in an external magnetic field having a field strength greater than four tesla;
    (b) creating a wave interference pattern in the sample by applying a pair of traveling excitation waves in a waveguide to the sample; and
    (c) reading out the image by exposing the sample to a reference wave similar to one of the pair of traveling excitation waves.

2. The method of claim 1 wherein the external magnetic field in step (a) is created via a magnet having a magnet bore and wherein step (b) comprises generating a pair of traveling excitation waves in the waveguide located inside the magnet bore.

3. The method of claim 2 wherein the waveguide is part of the magnet bore.

4. The method of claim 2 wherein the waveguide is inserted into the magnet bore.

5. The method of claim 1 wherein step (b) comprises applying a pair of counter-propagating traveling excitation waves to the sample.

6. The method of claim 5 wherein in step (b), a magnetic field gradient is applied to the sample, the magnetic field gradient having a gradient direction parallel to a propagation direction of one of the pair of counter-propagating traveling excitation waves.

7. The method of claim 5 wherein the external magnetic field in step (a) is created via a magnet having a magnet bore with a waveguide located therein and wherein, in step (b), the counter-propagating waves are generated inside of the waveguide by a pair of patch antennas.

8. The method of claim 1 wherein the reference wave produces a free induction decay response signal and wherein the image is created by inverting the free induction response signal by one of filtered backscattering, a generalization of an algebraic reconstruction technique (ART) of conventional computed tomography (CT) to diffraction tomography and a simultaneous iterative reconstructive technique (SIRT).

9. Apparatus for generating a magnetic resonance image of a sample in a magnetic resonance scanner, comprising:
    a magnet that generates in the sample an external magnetic field having a field strength greater than four tesla;
    an RF generator that creates a wave interference pattern in the sample by applying a pair of traveling excitation waves in a waveguide to the sample; and
    a receiver that reads out the image by exposing the sample to a reference wave similar to one of the pair of traveling excitation waves.

10. The apparatus of claim 9 wherein the magnet has a magnet bore and the RF generator comprises the waveguide located inside the magnet bore.

11. The apparatus of claim 10 wherein the waveguide is part of the magnet bore.

12. The apparatus of claim 10 wherein the waveguide is inserted into the magnet bore.

13. The apparatus of claim 9 wherein the RF generator comprises an RF source that applies a pair of counter-propagating traveling excitation waves to the sample.

14. The apparatus of claim 13 further comprising a magnet device that applies a magnetic field gradient is applied to the sample, the magnetic field gradient having a gradient direction parallel to a propagation direction of one of the pair of counter-propagating traveling excitation waves.

15. The apparatus of claim 13 wherein the magnet has a magnet bore with the waveguide located therein and wherein, the RF generator comprises a pair of patch antennas that generate the counter-propagating waves inside of the waveguide.

16. The apparatus of claim 9 wherein the reference wave produces a free induction decay response signal and wherein the receiver comprises a processor that creates the image by inverting the free induction response signal by one of filtered backscattering, a generalization of an algebraic reconstruction technique (ART) of conventional computed tomography (CT) to diffraction tomography and a simultaneous iterative reconstructive technique (SIRT).

* * * * *